(12) United States Patent
Bhat et al.

(10) Patent No.: US 9,383,925 B2
(45) Date of Patent: Jul. 5, 2016

(54) PAGE COMPRESSION STRATEGY FOR IMPROVED PAGE OUT PROCESS

(71) Applicant: International Business Machines Corporation, Armonk, NY (US)

(72) Inventors: Suma M. B. Bhat, Bangalore (IN); Chetan L. Gaonkar, Kumta (IN); Vamshi K. Thatikonda, Karimnagar (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/972,248

(22) Filed: Dec. 17, 2015

(65) Prior Publication Data

US 2016/0098210 A1   Apr. 7, 2016

Related U.S. Application Data

(63) Continuation of application No. 14/317,219, filed on Jun. 27, 2014.

(51) Int. Cl.
 G06F 3/06 (2006.01)
 G06F 9/455 (2006.01)

(52) U.S. Cl.
 CPC ............ *G06F 3/0608* (2013.01); *G06F 3/0611* (2013.01); *G06F 3/0644* (2013.01); *G06F 3/0661* (2013.01); *G06F 3/0664* (2013.01); *G06F 3/0683* (2013.01); *G06F 9/45558* (2013.01); *G06F 2009/45583* (2013.01)

(58) Field of Classification Search
 None
 See application file for complete search history.

(56) References Cited

U.S. PATENT DOCUMENTS

| | | | |
|---|---|---|---|
| 7,587,572 B1 | 9/2009 | Stenstrom | |
| 8,516,005 B2 | 8/2013 | Ergan et al. | |
| 8,645,338 B2 | 2/2014 | Barsness et al. | |
| 2006/0101223 A1* | 5/2006 | Lekatsas | G06F 12/0802 711/173 |
| 2010/0161934 A1* | 6/2010 | Alvarez | G06F 12/1009 711/206 |
| 2012/0060012 A1* | 3/2012 | Olszewski | G06F 12/1009 711/171 |
| 2013/0073798 A1 | 3/2013 | Kang et al. | |
| 2014/0372715 A1 | 12/2014 | Bak et al. | |
| 2015/0113232 A1 | 4/2015 | Kumar et al. | |
| 2015/0301843 A1* | 10/2015 | Guo | G06F 9/45558 718/1 |
| 2015/0301946 A1* | 10/2015 | Guo | G06F 12/1009 711/6 |
| 2015/0378612 A1 | 12/2015 | Bhat et al. | |

OTHER PUBLICATIONS

List of IBM Patents or Patent Applications Treated As Related, Dated Feb. 18, 2016, 2 pages.

* cited by examiner

*Primary Examiner* — Charles Rones
*Assistant Examiner* — Hewy Li
(74) *Attorney, Agent, or Firm* — Stephen R. Yoder

(57) ABSTRACT

A page compression strategy classifies uncompressed pages selected for compression. Similarly classified pages are compressed and bound into a single logical page. For logical pages having pages with more than one classification, a weighting factor is determined for the logical page.

1 Claim, 4 Drawing Sheets

PAGE COMPRESSION STRATEGY FOR IMPROVED PAGE OUT PROCESS

FIELD OF THE INVENTION

The present invention relates generally to the field of storage accessing and control and more particularly to memory partitioning.

BACKGROUND OF THE INVENTION

Active memory sharing (AMS) is a memory virtualization technology that allows multiple partitions to share a pool of physical memory. This is designed to increase system memory utilization, thereby enabling you to realize a cost benefit by reducing the amount of physical memory required.

Active memory expansion (AME) is a feature available on commercially available computer systems. AME allows a partition to expand its memory up to a given factor. This memory expansion is obtained using in-memory data compression. AME relies on the real-time compression of data stored in memory to increase the amount of available memory. When AME is enabled, the operating system compresses a portion of the real memory, generating two pools: (i) compressed; and (ii) uncompressed memory. Both AME and AMS are distinct, but compatible, features related to memory virtualization.

Steal time is the percentage of time a virtual CPU waits for a real CPU while the hypervisor is servicing another virtual processor. CPU time, or CPU usage, can be reported for: (i) each thread; (ii) each process; and/or (iii) the entire system. Moreover, depending on what exactly the CPU was doing, the reported values may be subdivided into distinct categories, including: (i) user time (the amount of time the CPU was busy executing code in user space); (ii) system time (the amount of time the CPU was busy executing code in kernel space, if this value is reported for a thread or process, then it represents the amount of time the kernel was doing work on behalf of the executing context, for example, after a thread issued a system call); (iii) idle time (for the whole system only) (the amount of time the CPU was not busy, or, otherwise, the amount of time it executed the system idle process, that is, idle time actually measures unused CPU capacity); and/or (iv) steal time (for the whole system only) (on virtualized hardware, is the amount of time the operating system wanted to execute, but was not allowed to by the hypervisor).

SUMMARY

In one aspect of the present invention, a method, a computer program product, and a system includes: identifying a set of uncompressed pages in primary memory storage; assigning to each uncompressed page in the set of uncompressed pages a class from a pre-determined set of classes; compressing a plurality of uncompressed pages assigned to a same class into a single logical page; and storing the single logical page in a secondary memory storage.

DETAILED DESCRIPTION

Figure 1:
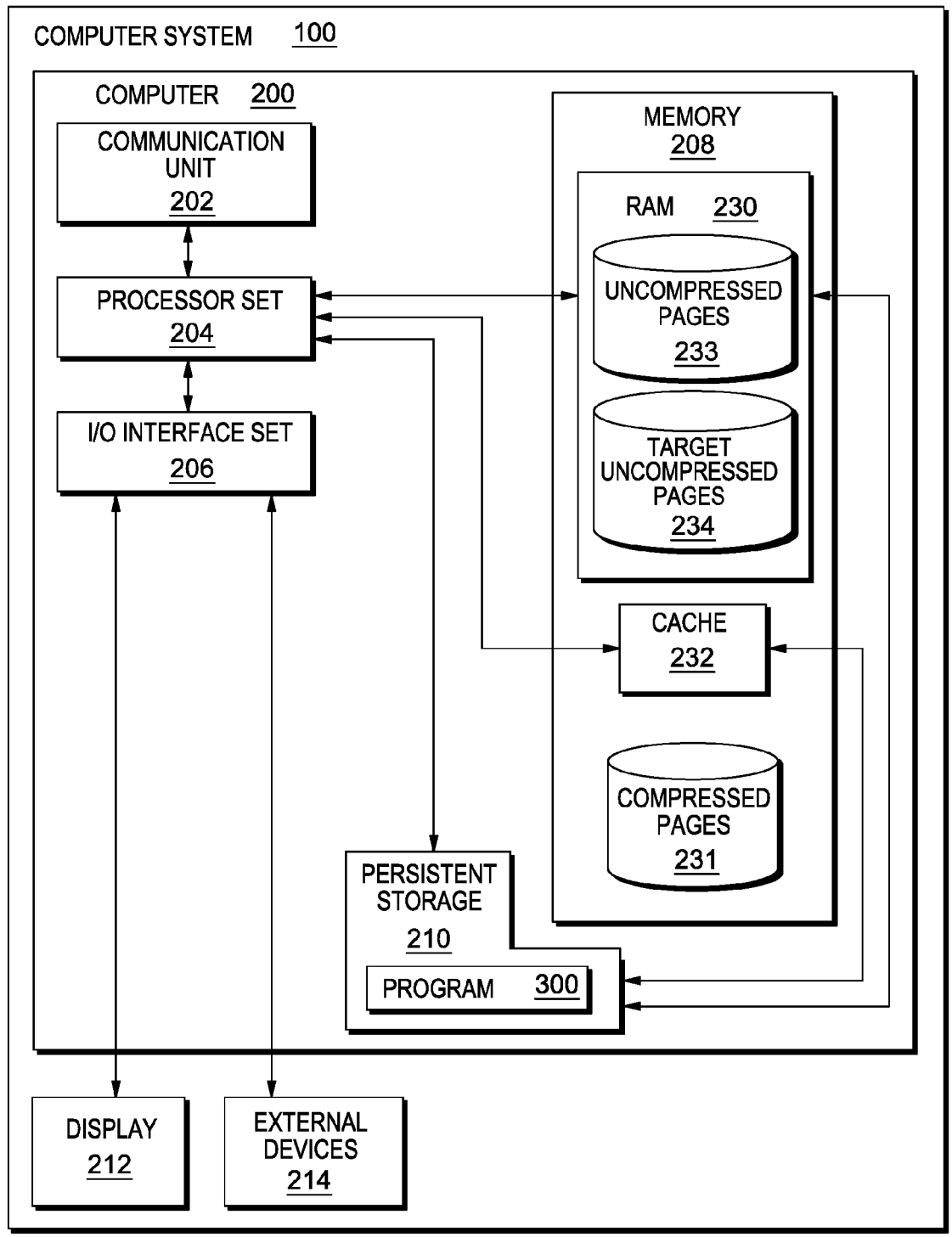
FIG. 1 is a schematic view of a first embodiment of a system according to the present invention.

A page compression strategy classifies uncompressed pages selected for compression. Similarly classified pages are compressed and bound into a single logical page. For logical pages having pages with more than one classification, a weighting factor is determined for the logical page. The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present invention will now be described in detail with reference to the Figures. FIG. 1 is a functional block diagram illustrating various portions of computer system 100, in accordance with one embodiment of the present invention, including: computer 200; communication unit 202; processor set 204; input/output (I/O) interface set 206; memory device 208; persistent storage device 210; display device 212; external device set 214; random access memory (RAM) devices 230; compressed pages store 231; cache memory device 232; uncompressed pages store 233; target uncompressed pages store 234; and program 300.

System 100 is, in many respects, representative of the various computer sub-system(s) in the present invention. Accordingly, several portions of System 102 will now be discussed in the following paragraphs.

System 100 may be a laptop computer, tablet computer, netbook computer, personal computer (PC), a desktop computer, a personal digital assistant (PDA), a smart phone, or any programmable electronic device. Program 300 is a collection of machine readable instructions and/or data that is used to create, manage, and control certain software functions that will be discussed in detail, below.

System 100 is shown as a block diagram with many double arrows. These double arrows (no separate reference numerals) represent a communications fabric, which provides communications between various components of system 100. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer readable storage media. In general, memory 208 can include any suitable volatile or non-volatile computer readable storage media. It is further noted that, now and/or in the near future: (i) external device(s) 214 may be able to supply, some or all, memory for system 100; and/or (ii) devices external to system 100 may be able to provide memory for system 100.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer readable storage medium that is also part of persistent storage 210.

Communications unit 202, in these examples, provides for communications with other data processing systems or devices external to system 100. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with computer 200. For example, I/O interface set 206 provides a connection to external device set 214. External device set 214 will typically include devices such as a keyboard, keypad, a touch screen, and/or some other suitable input device. External device set 214 can also include portable computer readable storage media such as, for example, thumb drives, portable optical or magnetic disks, and memory cards. Software and data used to practice embodiments of the present invention, for example, program 300, can be stored on such portable computer readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the present invention. However, it should be appreciated that any particular program nomenclature herein is used merely for convenience, and thus the present invention should not be limited to use solely in any specific application identified and/or implied by such nomenclature.

Program 300 operates to classify uncompressed pages prior to compression. The classified pages are compressed in such a way that similar classes of pages are compressed together into one, or more, logical pages. In that way, during a page-out process, only similarly classified, or categorized, pages are paged out.

In AMS, the cumulative logical memory size across all AMS partitions may be greater than the actual size of physical memory. In the case where the cumulative logical memory size across all of such partitions is greater than the size of physical memory, the hypervisor pages out partitions' logical memory to the virtual input/output server (VIOS) paging space (an AMS paging device). In this environment, according to some embodiments of the present invention, the operating system classifies memory objects into different classes so that the class of a memory object is known in advance of a page out. In that way, the cost associated with paging out a given set of memory objects is known according to the assigned class. Cost, as used here, reflects, at least in part, the burden of paging out hot data and/or compressed data compared to the burden of paging out cold data and/or non-clock data. Because the operating system has a different page out strategy for paging different characteristics, or classes, it can readily provide a hint to hypervisor for stealing specified pages. Otherwise, the hypervisor may steal OS-critical pages.

For an OS with AME enabled, the hypervisor page-stealing mechanism might choose to page out the page that is in either compressed form or uncompressed form. Mostly, this page-stealing activity takes place on compressed data (because the compressed data is generally least recently used).

Some embodiments of the present invention recognize the following facts, potential problems and/or potential areas for improvement with respect to the current state of the art: (i) due to compression, multiple uncompressed pages may fit into single logical page (of pageable size); (ii) a problem arises when multiple uncompressed pages of opposite characteristics are compressed and fit into a single logical page; (iii) conventional operating systems don't have a method available to uniquely identify the class of a logical page that is a mixture of pages belonging to different classes; (iv) conventional operating systems don't have a method available to classify a logical page that is a mixture of pages belonging to different classes; (v) conventional operating systems don't have a page-out strategy for compressed pages within a logical page having a mixture of pages belonging to different classes; (vi) conventional operating systems are unable to provide any stealing hint to a hypervisor regarding logical pages having mixed a mixture of pages belonging to different classes; (vii) conventionally, the hypervisor may simply steal any mixed-class pages, resulting in performance impact; (viii) active memory sharing (AMS) provides the user with the ability to oversubscribe memory on a system at the logical partition (LPAR) level; (ix) the number of LPARs that could be created is limited by the amount of physical memory in a machine because an LPAR always had dedicated physical memory; (x) with AMS support, a user can create more LPAR's on the system by over-committing physical memory; (xi) the cumulative logical memory size across all AMS partitions can be greater than the size of physical memory; (xii) where the cumulative logical memory size across all LPARs is greater than the size of physical memory, the hypervisor pages out partitions' logical memory to secondary memory storage; (xiii) AMS support is modeled somewhat after shared processor support in that each AMS LPAR has its own paging space; (xiv) the time period that hot data spends in paging space is less than that time period for cold data; (xv) when active memory expansion (AME) is enabled for an LPAR, the operating system will compress a portion of the LPAR's memory and leave the remaining portion of memory uncompressed (this results in memory effectively being broken up into two pools—a compressed pool and an uncompressed pool); (xvi) when the uncompressed pool reaches a maximum threshold, the OS compresses the least recently accessed data and moves it from the uncompressed pool to the compressed pool (this process results in a free page being used to do compression of an uncompressed page selected for compression).

The following use cases are provided to help the reader understand some conditions where some embodiments of the present invention are helpful. Consider a scenario where Page A (a kernel lock page) and Page B (a working segment page) are compressed into a single page. Kernel lock (klock) is a mechanism for an operating system to lock the kernel data in memory until the time when no other option is left but to page the kernel data out. Klock pages contain the kernel data in the form of a pagable kernel. Page A is critical because it is a klock page. The operating system's local paging has a policy to not page out Page A so long as other pages are available to page out. Page B is not as critical as Page A. In this example, Page A is a working segment page, a non-critical page. When both pages are compressed into one single logical page, Page C, the hypervisor does not recognize the two classes of pages within the Page C. Accordingly, it may steal Page C, including the klock page, Page A. If the hypervisor steals Page C, it will violate the OS page-out strategy, which is not to page out critical pages, such as Page A. Further, by not stealing Page C, the hypervisor also violates the OS page-out strategy of actively paging out any non-critical pages, such as Page B. This situation occurs because Page C is a compressed mixture of both critical and non-critical pages.

Consider another scenario where a single logical page, Page D, is to be paged out and is in a compressed form. Page D contains compressed data with: (i) the highest access count, Page E; and (ii) the lowest access count, Page F. A page having the highest access count indicates that there is a regular need for this page. When Page E is paged out, which will often be the case, Page F, having data with the lowest access count, will also be paged in. This type of mixing of compressed data (combining both hot and cold data) may result in a failure to apply the best page-out strategy for hypervisor stealing, because the cooperative memory management (CMM) of the OS cannot provide the best stealing hint to the hypervisor.

Consider yet another scenario where a logical page having a mixture of compressed pages belonging to different classes is paged-out. In that case, there is a possibility of an immediate page-in of the logical page for access to hot data. During the page-in process, the cold data (currently not needed) is also paged-into memory along with hot data (currently needed), this operation exerts pressure on the memory pool. For example, Cold Data is mixed with Hot Data in Compressed Page. When Compressed Page is paged out when the operating system needs Hot Data, the result is the page-in of Compressed Page. In that way, Cold Data is paged in unnecessarily when it is not needed in memory. This type of mixing of compressed data (combining both hot and cold data) may also result in a failure to apply the best page-out strategy for hypervisor stealing.

The above scenarios illustrate what some embodiments of the present invention recognize regarding AME and/or OS shortcomings, including: (i) AME and/or OS does not have a mechanism to take it into account the class of the data when compressing and mixing the data to make a logical page of pageable size; (ii) CMM does not uniquely identify a logical page of compressed data for containing only data of specified characteristics; and/or (iii) there is no priority, or weighting, maintained for pages of compressed data having mixed characteristics.

Some embodiments of the present invention function to avoid page out of data categorized as: (i) critical data; (ii) hot data along with no critical data; and/or (iii) cold data. In this example, multiple compressed pages having the same characteristics are combined into a logical page. In that way, the operating system comfortably hints, or suggests, to the hypervisor whether or not to steal certain categories of pages. If two compressed klock pages are stored on a single logical page, the OS is able to hint to the hypervisor not to steal that single local page because of the critical nature of the compressed page content.

Some embodiments of the present invention provide a method to identify the class, or category, for a logical page composed of multiple compressed pages of different classes, and to hint to the hypervisor whether or not to steal a specified logical page based on the identified class.

Figure 2:
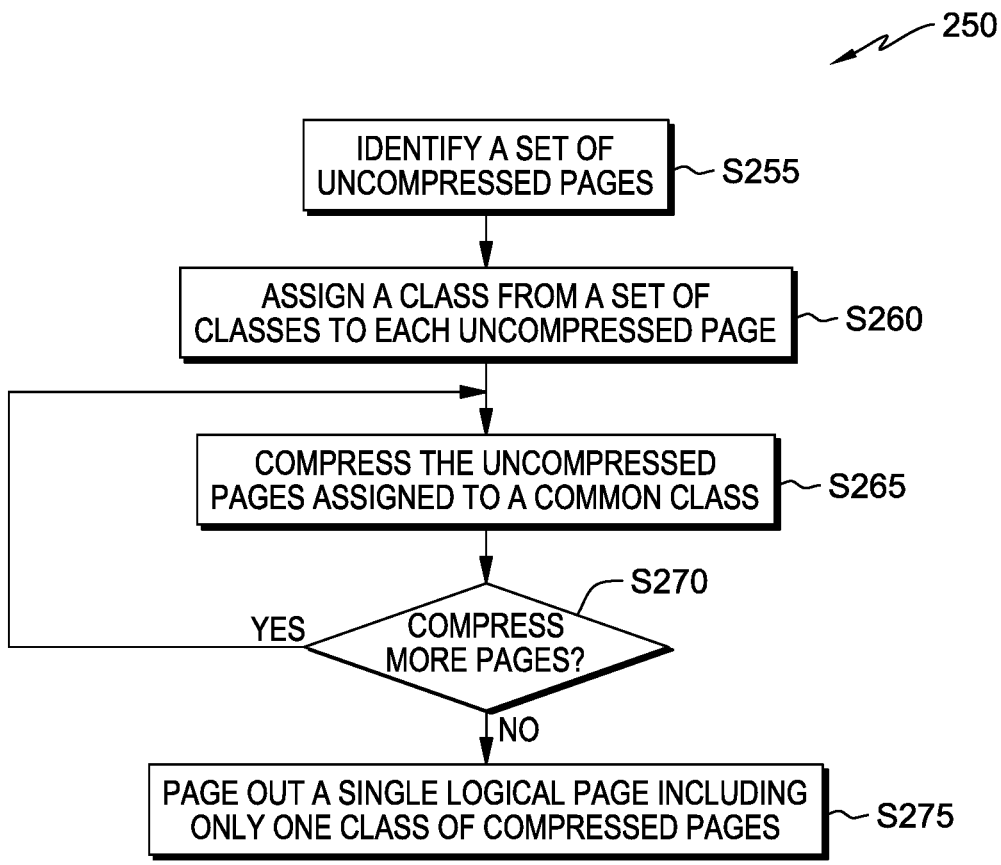
FIG. 2 is a flowchart showing a method performed, at least in part, by the first embodiment system.
Figure 3:
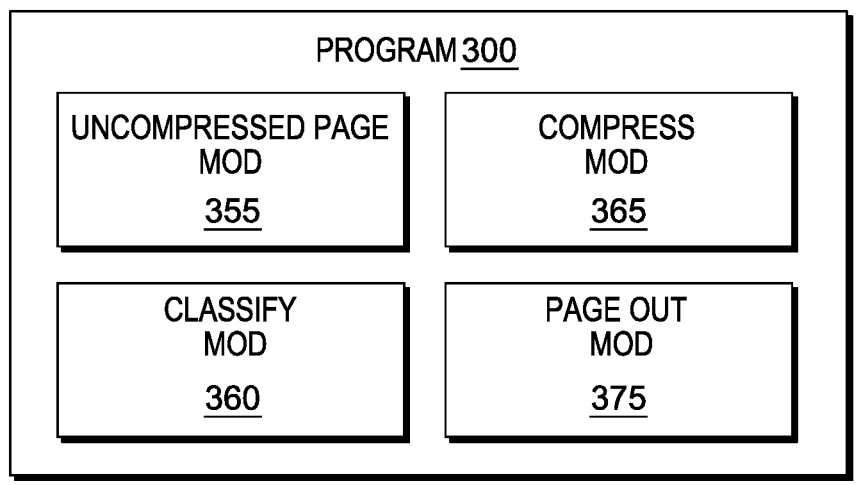
FIG. 3 is a schematic view of a machine logic (for example, software) portion of the first embodiment system.

FIG. 2 shows flowchart 250 depicting a first method according to the present invention. FIG. 3 shows program 300 for performing at least some of the method steps of flowchart 250. This method and associated software will now be discussed, over the course of the following paragraphs, with extensive reference to FIG. 2 (for the method step blocks) and FIG. 3 (for the software blocks).

Processing begins at step S255, where uncompressed page module 355 identifies a set of target uncompressed pages in a primary memory, such as RAM. A target uncompressed page is a page having characteristics such that it is appropriate to compress the page. Conventional operating system implementations consider the least recently used (LRU) algorithm when selecting a target uncompressed page for compression. Some embodiments of the present invention consider one, or more, of the following factors for selecting a "target uncompressed page" for compression: (i) LRU algorithm; (ii) a set of OS and/or application classes such as: working segment pages, file segment pages, client pages, and/or klock pages (the OS may classify pages into one, or more, of these classes); (iii) compression algorithm for compressing similar classes of pages. In this example, the set of target uncompressed pages is a sub-set of all uncompressed pages in RAM 230. Alternatively, all uncompressed pages in the computer system are "target uncompressed pages." In such an embodiment, there may not exist both the uncompressed pages store 233 and target uncompressed pages store 234.

Processing proceeds to step S260, where classify module 360 assigns a class from a set of classes to each target uncompressed page. The target uncompressed pages are supplied as input to the classify module. The classify module classifies the pages into various classes, or groups, that may include one, or more, of the following: (i) working segment pages; (ii) file segment pages; (iii) client pages; and/or (iv) klock pages. In this example, one class is assigned to each target uncompressed page. Alternatively, one, or more, classes are assigned to each target uncompressed page.

Processing proceeds to step S265, where compress module 365 compresses together the uncompressed pages assigned to a common class. The compressed pages are stored either in primary memory or secondary memory, depending, at least in part, on the capacity of the primary memory. In this example, compressed pages are shown in memory 208 generally, while uncompressed pages are shown in RAM 230. Alternatively, both compressed and uncompressed pages are stored in RAM 230. Alternatively, compressed and/or uncompressed pages are stored in VIOS paging space. Alternatively, compressed pages are stored in an external disk drive. Some embodiments of the present invention distinguish between primary memory storage such as RAM, and/or other volatile memory storage, and secondary memory storage, such as disk storage, and/or other non-volatile memory storage. In this example, compress module attempts to compress, into a single logical page, each target uncompressed page having a same class. In some instances, there may be too many pages to compress into a single logical page. Also, there may be instances where there are too few pages necessitate compression. When this occurs, the pages may not be compressed. If mixed pages are compressed, a weighting scheme, described in further detail below, may be used.

Processing proceeds to step S270, where compress module 365 determines whether there are more, or additional, pages to compress by referring to target uncompressed pages store 234. As stated above, certain pages are targeted for compression with an objective, at least in part, to increase the amount of available memory, particularly RAM, or other primary memory storage. In this embodiment, a threshold available memory condition triggers page compression. So long as the threshold is not met, compress module 365 continues to compress target uncompressed pages. Alternatively, a user initiates page compression and compress module 365 continues to compress the pages, identified as "target uncompressed pages", until no further page compression is warranted. That is, generally there will be some sub-set of target uncompressed pages that do not necessitate compression due to factors, such as: (i) insufficient number of common-class pages; and/or (ii) insufficient benefit from compressing the remaining uncompressed pages. Alternatively, the OS periodically performs page compression. In some embodiments, a set of target uncompressed pages is generated periodically. Regardless of the basis for page compression, compress module 365 applies the appropriate algorithm to determine whether or not to compress additional uncompressed pages.

Processing ends at step S275, where page out module 375 pages out a single logical page including only one class of compressed pages. As a result of performing the above-discussed process, there are logical pages associated with certain classes of pages. Accordingly, page out module 375 is able to select which of the classes of logical pages to page out. In this example, the page out module selects a single logical page that is classified as working segment pages because those pages are considered to be non-critical according to the OS page-out policy.

Figure 4:
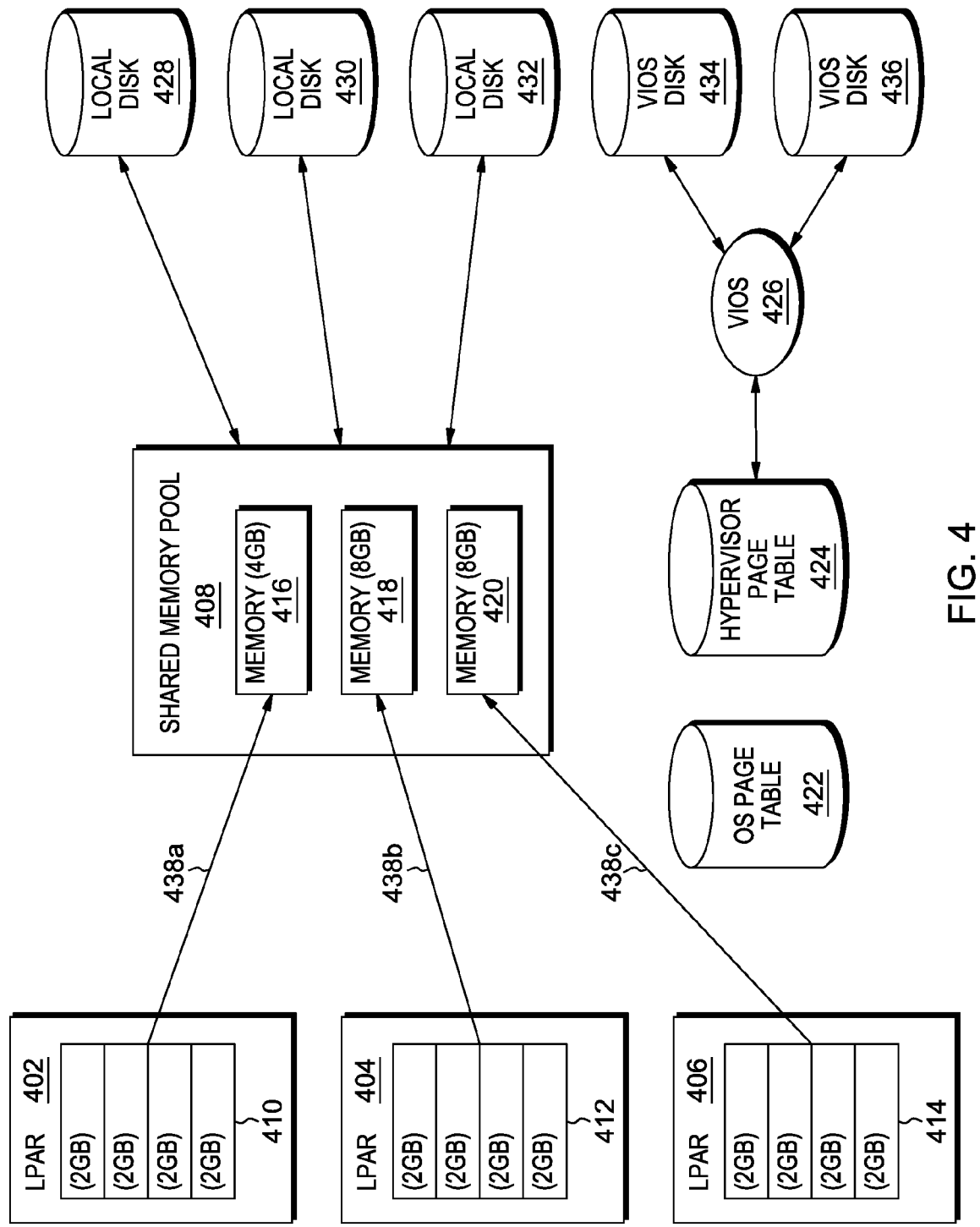
FIG. 4 is a schematic view of a second embodiment of a system according to the present invention.

FIG. 4 is a diagram depicting an embodiment of the present invention practiced in an AMS environment. Logical partitions (LPARs) 402, 404, and 406 have a particular physical memory, for example 8 GB. Shared memory pool 408 provides for memory requirements, despite the overbooking of physical memory 410, 412, 414 corresponding to the LPARs. In this example, 24 GB of logical memory is mapped (shown by mapping lines 438a, 438b, and 438c) to 20 GB of physical memory. That is, memory portion 416, of shared memory pool 408, provides for mapping (438a) only 4 GB of physical memory from 8 GB of logical memory 410. It is further shown that logical memories 412 and 414, 8 GB each, are mapped to 8 GB each of physical memory 418 and 420, respectively. Also illustrated are: OS page table 422; hypervisor page table 424; virtual input/output server (VIOS) 426; local disks 428, 430, 432; and VIOS disks 434, 436.

In the illustrated environment, OS page table 422 contains uncompressed pages of the three LPARs 402, 404, and 406. These pages are compressed, as needed in logical memories 410, 412, and 414. Compressed pages are mapped to shared memory pool 408, where pages are stored on local disks 428, 430, and 432. As needed, to reduce memory allocation, the hypervisor steals compressed pages to hypervisor page table 424, where pages are stored over VIOS 426 on VIOS disks 434 and 436.

Some embodiments of the present invention propose to classify all uncompressed pages selected for compression into categories including: (i) critical (klock); (ii) non critical (non klock working segment page); (iii) hot page (high access count); and/or (iv) cold page (less access count). The pages from each category are compressed together to ensure that pages of the same characteristics (class) are bound in a single logical page. In this example, logical memories 410, 412, and 414 are divided into logical pages containing similarly classified elements. In that way, when a logical page is "stolen" by the hypervisor and recorded in hypervisor page table 424, only similarly classified pages are stolen at a given time. This reduces the number of violations of the operating system's local paging policy. Where binding is not possible for some pages, an associated weighting factor, as explained below, is used. The associated weighting factor applies to a logical page composed of compressed data with different characteristics.

Figure 5:
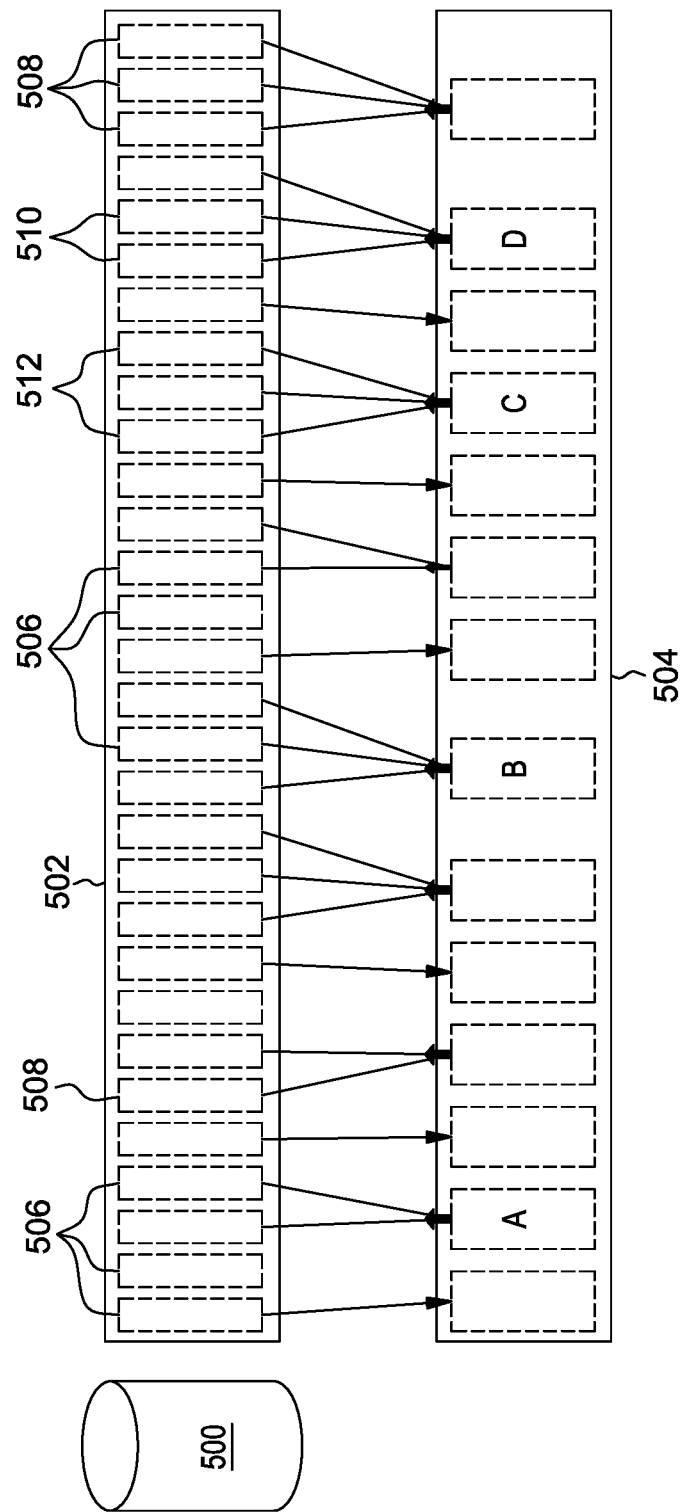
FIG. 5 is a schematic view of a paging device of a system according to an embodiment of the present invention.

FIG. 5 is a diagram illustrating a weighting process according to an embodiment of the present invention. The diagram illustrates a paging strategy that allows for mixing of page types, or classes. OS paging device 500 is shown with uncompressed page store 502, and a corresponding compressed page store 504. Compressed page store includes several logical pages, four of which are labeled for further discussion, specifically, pages A, B, C, and D. Each logical page A, B, C, and D includes one, or more compressed data type, including: (i) cold compressed data 506; (ii) non-klock compressed data 508; (iii) klock compressed data 510; and/or (iv) hot compressed data 512.

Weighting is a process applied to single logical pages, such as pages A, B, C, and D, having mixed classes of compressed pages. Depending on the information technology (IT) department's policy and/or other considerations, some logical pages may be made up of mixed classes of data. The weight factor assigned to a given logical page is used for reference by the OS for hinting to the hypervisor regarding which logical page to steal, where a page stealing process is available. According to the illustration, page A is made up of one unit of cold compressed data and one unit of klock compressed data. The resulting page weight factor, WF, is illustrated by the following equation: $WF=1x+0$, where x is the component weight factor for a unit of klock compressed data. Continuing with the illustration, page B is made up of one unit of cold compressed data and two units of non-klock working segment data. The resulting page weight factor is illustrated by the following equation: $WF=2y+0$, where y is the component weight factor for a unit of non-klock working segment data. Further, page C is made up of one unit of cold compressed data and two units of hot compressed data. The resulting page weight factor is illustrated by the following equation: $WF=2z+0$, where z is the component weight factor for a unit of hot compressed data. Finally, page D is made up of one unit of cold uncompressed data and two units of klock compressed data. The resulting page weight factor is illustrated by the following equation: $WF=2x+0$.

Some embodiments of the present invention may include one, or more, of the following features, characteristics and/or advantages: (i) OS will easily prompt, or guide, the hypervisor on stealable pages and the OS paging strategy will not be compromised; (ii) hot pages will not be paged out; (iii) unnecessary page in/page out of pages that are not required is considerably reduced (because we are trying to avoid the mixture); (iv) with associated weighting for mixed pages, the higher weighted pages are kept in memory to the extent possible; (v) the primary benefit of active memory sharing (AMS) is the ability to oversubscribe memory on a system at the LPAR level; (vi) compressed pages of the same characteristics are bound into a single logical page (if two compressed klock pages are fitted into a logical page, this binding process gives an opportunity for the OS to hint that the hypervisor is not to steal the page); and/or (vii) provide a method to identify similar classes of pages, and group compressed versions of pages identified as belonging to similar classes into a single page.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as may be being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Computer: any device with significant data processing and/or machine readable instruction reading capabilities including, but not limited to: desktop computers, mainframe computers, laptop computers, field-programmable gate array (fpga) based devices, smart phones, personal digital assistants (PDAs), body-mounted or inserted computers, embedded device style computers, application-specific integrated circuit (ASIC) based devices.

What is claimed is:

1. A method comprising:
   identifying a set of uncompressed pages in a primary memory storage;
   assigning to each uncompressed page in the set of uncompressed pages one or more corresponding classes from a pre-determined set of classes;
   compressing a plurality of pages in the set of uncompressed pages, a first set of pages of the plurality of pages having been assigned to a first class are compressed into a single logical page, a second set of pages of the plurality of pages having been assigned to a corresponding class different than the first class are compressed into a separate logical page different than the single logical page;
   determining a page weight factor for the single logical page;
   storing the single logical page in a secondary memory storage;
   paging in the single logical page into the primary memory storage;
   prompting a hypervisor to steal the single logical page, based, at least in part, on the page weight factor;
   wherein:
   the page weight factor is made up of component weight factors assigned individually to each page within the single logical page;
   paging in the single logical page causes only a set of compressed pages assigned to the same class to be paged into the primary memory storage; and
   the first class of pages is a member of a group consisting of:
   working segment pages;
   file segment pages;
   client pages; and
   klock pages.

* * * * *